United States Patent
Ebeling

(10) Patent No.: US 6,829,283 B2
(45) Date of Patent: Dec. 7, 2004

(54) SEMICONDUCTOR LASER

(75) Inventor: Karl Joachim Ebeling, Ulm (DE)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 10/254,464

(22) Filed: Sep. 25, 2002

(65) Prior Publication Data

US 2003/0058911 A1 Mar. 27, 2003

(30) Foreign Application Priority Data

Sep. 26, 2001 (DE) .......................... 101 47 353

(51) Int. Cl.$^7$ ............................ H01S 3/10; H01S 5/00; H01S 3/14; H01S 3/082
(52) U.S. Cl. ............................ 372/97; 372/68; 372/23; 372/43
(58) Field of Search ............................ 372/23, 43, 44, 372/45, 68, 97, 50, 99, 46, 75

(56) References Cited

U.S. PATENT DOCUMENTS

| | | | | |
|---|---|---|---|---|
| 5,781,575 A | * | 7/1998 | Nilsson ........................ | 372/50 |
| 5,796,771 A | * | 8/1998 | DenBaars et al. ............ | 372/75 |
| 6,567,454 B1 | * | 5/2003 | Fischer et al. ................ | 372/68 |
| 6,600,761 B1 | * | 7/2003 | Fischer et al. ................ | 372/23 |
| 6,608,846 B1 | * | 8/2003 | Fischer et al. ................ | 372/8 |

OTHER PUBLICATIONS

Lim S.F., Hugdings J.A., Li G.S., Yuen W., Lau K.Y., Chang–Hasnain C.J.: Self Pulsating and bistable VCSEL with controllable intracavity quantum–well saturable absorber. In Electronics Lett., vol. 33, No. 20, pp. 1708–1710 (1997).

Hudgings J.A., Stone R.J., Li Gl.S., Yuen W., Lau K.Y., Chang–Hasnain C.J.: The Physics of negative differential resistance of an intracavity voltage–controlled absorber in a vertical–cavity surface–emitting laser. In Appl. Phys. Lett., vol. 73, No. 13, pp. 1796–1798 (1998).

Fischer A.J., Choquette K.D., Chow W.W., Hou H.Q., Gelb K.M., Coupled resonator vertical–cavity laser diode. In Appl. Phys. Lett., vol. 75, No. 19, pp. 3020–3022 (1998).

Fischer A.J., Chow W.W., Choquette K.D., Allermann A.A., Gelb K.M.: Q–switched operation of a coupled–resonator vertical–cavity laser diode. In Appl. Phys. Lett., vol. 76, No. 15, pp. 1975–1977 (2000).

Stanley R.P., Houdre R., Oesterle U., Ilegems M., Weisbuch C.: Coupled semiconductor microcavities. In Appl. Phys. Lett., vol. 65, No. 16, pp. 2093–2095 (1994).

Michler P., Hipert M., Reiner G.: Dynamics of dual–wavelength emission from a coupled semiconductor microcavity laser. In Appl. Phys. Lett., vol. 70, No. 16, pp. 2073–2075 (1997).

Pellandini P., Stanley R.P., Houdre R., Oesterle U., Ilegems M., Weisbuch C.: Dual–wavelength laser emission from a coupled semiconductor microcavity. In Appl. Phys. Lett., vol. 71, No. 7, pp. 864–866 (1997).

Brunner M., Gulden K., Hovel R., Moser M., Carlin J.F., Stanley R.P., Ilegems M.: Continuous–wave dual–wavelength lasing in a two–section vertical–cavity laser. In IEEE Photonics Tech. Lett., vol. 12, No. 10, pp. 1316–1318 (2000).

* cited by examiner

Primary Examiner—Wilson Lee
Assistant Examiner—Armando Rodriguez
(74) Attorney, Agent, or Firm—Altera Law Group, LLC; Jeffrey R. Stone

(57) ABSTRACT

A semiconductor laser (100) comprises, in succession, a first reflector (102), a first optically active region (104), which can emit light of a first wavelength ($\lambda_1$), a second reflector (107), a second optically active region (110), which can emit light of a second wavelength ($\lambda_2$), which is shorter than the first wavelength ($\lambda_1$), and a third reflector (112), wherein the two optically active regions (110, 112) are able to emit their light on a common optical axis (118) in a common emission direction (119).

16 Claims, 2 Drawing Sheets

SEMICONDUCTOR LASER

The invention relates to a semiconductor laser.

Semiconductor lasers, for example surface-emitting semiconductor lasers (VCSEL=vertical cavity surface emitting laser), are preferred light sources in the short-range area for optical data transmission in the data communications area over short and medium ranges of up to 10 km in length with high data transmission rates, the so-called bit rates. For the optical data transmission, the light emitted by the semiconductor lasers is coupled into optical fibres. In this case, the bit rate is limited principally by the time required for signal generation. By way of example, the direct current modulation of a VCSEL for generating an optical data signal limits the bit rate of the VCSEL to about 12.5 Gbit/s. The increase in electronic communication results in an increase in the requirements made of the optical data transmission and thus also the maximum achievable bit rate.

Higher bit rates of 40 Gbit/s, for example, are usually realized by means of external modulation or by means of wavelength bundling and are primarily used in optical data transmission for long ranges in excess of 10 km. In this case, high-power lasers are normally used to generate the optical signals.

A promising approach for increasing the bit rate over short and medium ranges, too, is wavelength bundling. In this case, usually a plurality of semiconductor lasers are used which each emit light at different wavelengths, each semiconductor laser emitting light of exactly one specific wavelength. In order to bundle the light signals emitted by the semiconductor lasers prior to coupling into an optical fibre, complicated integrated-optical or fibre-optic multiplexer elements have been necessary heretofore. However, these multiplexer elements impair the quality of the transmitted optical data signals on account of noise, scattering and absorption effects. Above all, a considerable additional outlay is necessary in order to carry out optical beam matching. Additionally, the electrical driving becomes more complicated and the chip area requirement rises.

The prior art discloses VCSELs in which either an active zone and a passive zone, cf. for example [1] to [4], or two active zones, cf. for example [5] to [8], are arranged adjacent to each other. The active zones serve for generating laser light and the passive zones serve as absorbers and thus as modulators or transmission switches. In the known VCSEL arrangements with a passive zone, an optical coupling of the two zones thus takes place in each VCSEL. Although laser light with two different wavelengths can be emitted in the case of the VCSELs with two active zones arranged one on the other, electronic-optical coupling of the two active zones always takes place. Consequently, the prior art does not disclose a VCSEL whose bit rate is higher than 12.5 Gbit/s.

The invention is therefore based on the problem of specifying a semiconductor laser in which the bit rate can be increased to above 12.5 Gbit/s in a simple manner and which can be produced simply and cost-effectively.

The problem is solved by means of a semiconductor laser having the features in accordance with the independent patent claim.

A semiconductor laser comprises a first reflector, a second reflector and a third reflector. A first optically active region is arranged between the first reflector and the second reflector, which can emit laser light of a first wavelength. Arranged between the second reflector and the third reflector is a second optically active region, which can emit laser light of a second wavelength, which is shorter than the first wavelength. The two optically active regions are essentially decoupled from one another both optically and electrically and can emit their laser light on a common optical axis in a common emission direction, the emission direction being directed along the optical axis from the first optically active region to the second optically active region.

One advantage of the invention can be seen in the fact that, on account of the optical and electrical decoupling of the two optically active regions, a semiconductor laser is created which can simultaneously generate two independent optical data signals in a simple manner, as a result of which the bit rate is increased by a factor of two. In this case, the skilful construction of the semiconductor laser has the effect that the laser light emitted by the first optically active region is transmitted essentially unimpeded through the second optically active region. The condition that the second wavelength is to be shorter than the first wavelength essentially avoids absorption of the laser light emitted by the first optically active region in the second optically active region. Consequently, the second optically active region does not perform the function of a transmission switch or modulator for the laser light emitted by the first optically active region. The semiconductor laser thus provides two independently controllable laser light sources with identical cross-sectional intensity distribution at two different wavelengths on an optical axis. This considerably reduces the chip area requirement before the input of an optical fibre.

A further advantage of the semiconductor laser is that the optical data signals emitted by the two optically active regions are emitted in a common emission direction on a common optical axis. The result of this is that the semiconductor laser can be optically coupled directly to an optical fibre for transmission of the emitted optical data signals, without requiring an optical component for wavelength bundling. Consequently, additional losses in such an optical component on account of noise, scatter and absorption effects cannot impair the emitted optical data signals. Thus, the optical data signals generated by the semiconductor laser can be coupled into the optical fibre with considerably reduced optical losses.

The semiconductor laser can be extended by further optically active regions and associated reflectors which are correspondingly stacked one on the other or arranged next to one another. Consequently, for the semiconductor laser, it is possible to achieve a further increase in the bit rate by an integer multiple in comparison with a semiconductor laser with a single optically active region. Clearly, in the case of an arrangement of n decoupled optically active regions, the bit rate can thus be increased by the factor n in comparison with just a single optically active region.

In a preferred embodiment of the semiconductor laser, Bragg reflectors are used as reflectors.

Preferably, in the semiconductor laser, an intermediate region is in each case provided between each optically active region and each adjacent Bragg reflector. This intermediate region serves for exactly setting the distance between two adjacent Bragg reflectors in order that the standing wave that forms between the two adjacent Bragg reflectors is set to the desired wavelength of the emitted laser light.

Preferably, at least one current confinement region is arranged in at least one intermediate region of the semiconductor laser adjacent to at least one of the two optically active regions. This current confinement region serves for controlling the current flow through the adjacent optically active region in such a way that the optical excitation in the optically active region is localized in a predetermined region. Thus, by way of example, the location of the optical excitation can be set to the optical axis.

The semiconductor laser is preferably designed as a surface-emitting semiconductor laser in which the Bragg reflectors and the active regions are arranged in stack form one above the other. This affords the considerable advantage that the Bragg reflectors and the active regions can be grown monolithically as a layer sequence in a multistage epitaxy method, in which case each stage of the epitaxy method can be correspondingly adapted in a simple manner depending on the layer to be produced. As an alternative, the semiconductor laser can also be designed as an edge-emitting semiconductor laser, for example as a DFB or DBR laser (DFB=distributed feedback, DBR=distributed Bragg reflector), in which the Bragg reflectors and the optically active regions are arranged next to one another.

In a preferred development of the semiconductor laser, the first Bragg reflector is set up in such a way that it comprises a reflectivity of $\geq 99\%$, preferably $\geq 99.7\%$, for the first wavelength and a reflectivity of $\leq 5\%$ for the second wavelength. Furthermore, the second Bragg reflector is set up in such a way that it comprises a reflectivity of $\geq 98\%$, preferably 99.3%, for the first wavelength and a reflectivity of $\geq 99\%$ preferably $\geq 99.7\%$, for the second wavelength. Moreover, the third Bragg reflector is set up in such a way that it comprises a reflectivity of $\leq 5\%$ for the first wavelength and a reflectivity of $\geq 98\%$, preferably 99.3%, for the second wavelength.

This ensures that optical coupling of the two optically active regions of the semiconductor laser is essentially avoided. The feedback of the laser light of the first optically active region is effected by means of the first Bragg reflector and the second Bragg reflector, while the feedback of the laser light of the second optically active region is effected by means of the second Bragg reflector and the third Bragg reflector. There is thus no overlap of the feedback regions of the two optically active regions.

The first Bragg reflector and the second Bragg reflector are preferably at a distance from one another such that a Fabry-Perot resonance with a half-value width of up to 5 nm for the first wavelength can form between the first Bragg reflector and the second Bragg reflector. Correspondingly, the second Bragg reflector and the third Bragg reflector are preferably at a distance from one another such that a Fabry-Perot resonance with a half-value width of up to 5 nm for the second wavelength can form between the second Bragg reflector and the third Bragg reflector.

In a preferred development of the invention, at least one part of each Bragg reflector is designed as an electrical connection region for the respectively adjacent optically active region, in order to supply the two optically active regions with current. In this case, the electrical connection regions are preferably doped in such a way that the electrical connection regions of the first Bragg reflector and of the third Bragg reflector comprise excess charge carriers of a first charge carrier type and the electrical connection region of the second Bragg reflector comprises excess charge carriers of a second charge carrier type. This has the advantage that, on account of a suitable doping of the Bragg reflectors, the current paths through the two optically active regions can be decoupled from one another. Accordingly, a first electric current can be coupled into the first optical region by means of the first Bragg reflector and the second Bragg reflector and a second electric current can be coupled into the second optical region by means of the second Bragg reflector and the third Bragg reflector, independently of the first electric current.

To that end, the second Bragg reflector preferably comprises a first electrical connection region for the first optically active region and a second electrical connection region—electrically insulated from the first electrical connection region—for the second optically active region. As an alternative, the second Bragg reflector may also comprise a first Bragg partial reflector for the first optically active region and a second Bragg partial reflector for the second optically active region. In that case, however, the two Bragg partial reflectors in each case comprise an independent electrical connection region, the two electrical connection regions of the two Bragg partial reflectors being electrically insulated from one another.

An exemplary embodiment of the invention is illustrated in the figures and is explained in more detail below. In this case, identical reference symbols designate identical components.

In the figures:

FIG. 1 shows a diagrammatic cross section through a semiconductor laser 100 in accordance with an exemplary embodiment of the invention.

Figure 1:
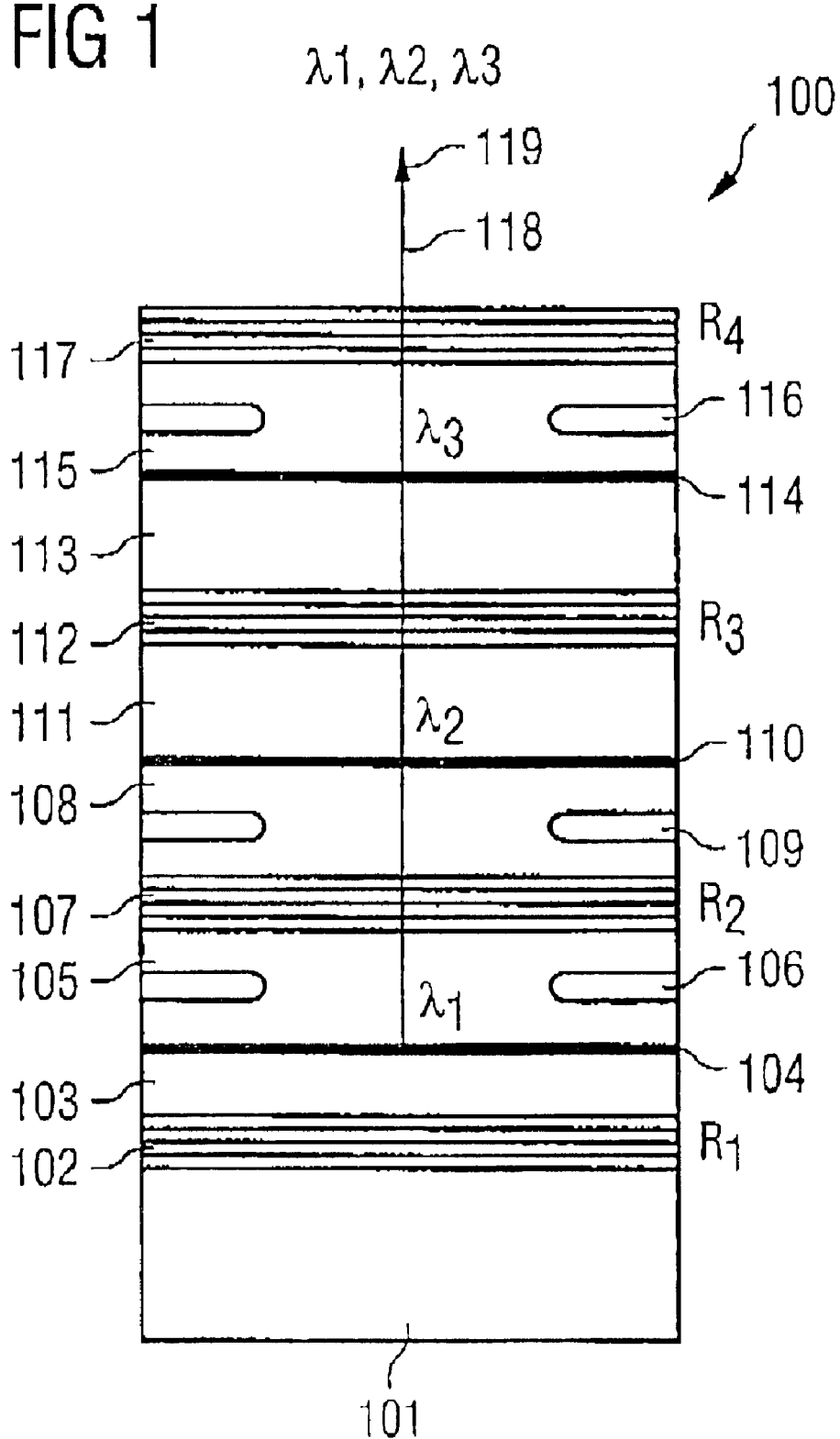
FIG. 1 shows a diagrammatic cross section through a semiconductor laser in accordance with an exemplary embodiment of the invention.

The semiconductor laser 100 in accordance with the exemplary embodiment of the invention is a surface-emitting semiconductor laser which is clearly composed of three individual surface-emitting semiconductor lasers stacked one above the other. Accordingly, the bit rate of the semiconductor laser 100 is increased by a factor of 3 compared with an individual surface-emitting semiconductor laser and reaches 30 Gbit/s in accordance with the exemplary embodiment.

The semiconductor laser 100 is grown epitaxially from a plurality of layers on a surface of a semiconductor substrate 101. In accordance with the exemplary embodiment, n-doped GaAs is used as the material for the semiconductor substrate 101.

Firstly, a first Bragg reflector 102, comprising a wavelength-dependent first reflectivity $R_1$, is arranged on the semiconductor substrate 101. In accordance with the exemplary embodiment, the first Bragg reflector 102 is an n-doped layer sequence comprising AlGaAs and GaAs which is applied in a suitable manner on the semiconductor substrate 101 and is n-doped by means of Si atoms.

Situated above the first Bragg reflector 102 is a first intermediate region 103, on which the first optically active region 104 is arranged. The first intermediate region 103, which is a layer of AlGaAs in accordance with the exemplary embodiment, serves for correctly setting the desired distance between the first optically active region 104 and the first Bragg reflector 102. In accordance with the exemplary embodiment, the first optically active region 104 is a quantum film structure comprising $In_{0.35}Ga_{0.65}As$ and GaAs which, in the electrically excited state, can emit laser light at a first wavelength of $\lambda_1=1,050$ nm.

Arranged on the first optically active region 104 is a second intermediate region 105 with an embedded first current confinement region 106 and, above that, a second Bragg reflector 107. In accordance with the exemplary embodiment, the second intermediate region 105 is in turn a layer of AlGaAs which serves for correctly setting the desired distance between the first optically active region 104 and the second Bragg reflector 107. In accordance with the exemplary embodiment, the first current confinement region 106 is a layer of laterally selectively oxidized $Al_xO_y$, which is approximately 30 nm thick and is also referred to as an oxide screen, and the second Bragg reflector 107 is a p-doped layer sequence comprising AlGaAs and GaAs which has a wavelength-dependent second reflectivity $R_2$ and is p-doped by means of C atoms.

On account of the distance between the two Bragg reflectors 102, 107, which can be influenced by means of the two intermediate regions 103, 105, a Fabry-Perot resonance with a narrow half-value width of only up to 5 nm can form for the first wavelength $\lambda_1$ in the resonator that is formed between the two Bragg reflectors 102, 107 and is pumped by the first optically active region 104.

Arranged above the second Bragg reflector 107 are a third intermediate region 108 with an embedded second current confinement region 109 and a second optically active region 110. Situated above the latter are a fourth intermediate region 111 and a third Bragg reflector 112. The two intermediate regions 108, 111 and the second current confinement region 109 have the same function with regard to the second optically active region 110 as the two intermediate regions 103, 105 and the first current confinement region 106 with regard to the first optically active region 104 and also comprise the same materials.

In accordance with the exemplary embodiment, the second optically active region 110 is a quantum film structure comprising $In_{0.33}Ga_{0.67}As$ and GaAs which, in the electrically excited state, can emit laser light at a second wavelength of $\lambda_2=1,030$ nm, and the third Bragg reflector 112 is an n-doped layer sequence comprising AlGaAs and GaAs which has a wavelength-dependent third reflectivity $R_3$ and is n-doped by means of Si atoms.

A fifth intermediate region 113, a third optically active region 114, a sixth intermediate region 115 with an embedded third current confinement region 116 and a fourth Bragg reflector 117 are arranged successively on the third Bragg reflector 112. In accordance with the exemplary embodiment, the third optically active region 114 is a quantum film structure comprising $In_{0.31}Ga_{0.69}As$ and GaAs which, in the electrically excited state, can emit laser light at a third wavelength of $\lambda_3=1,010$ nm, and the fourth Bragg reflector 117 is a p-doped layer sequence comprising AlGaAs and GaAs which has a wavelength-dependent fourth reflectivity $R_4$ and is p-doped by means of C atoms.

The two intermediate regions 113, 115 and the third current confinement region 116 have the same function with regard to the third optically active region 114 analogously to the two intermediate regions 103, 105 and the first current confinement region 106 or to the two intermediate regions 108, 111 and the second current confinement region 109. Accordingly, the material selection is performed in the same way.

The three optically active regions 104, 110, 114 are arranged in a manner stacked one above the other on a common optical axis 118 and emit the laser light generated by them on the optical axis 118 in a common emission direction 119. The semiconductor laser 100 is constructed in such a way that the emitted wavelength of the optically active regions decreases in the emission direction 119. Furthermore, the reflectivities $R_1$, $R_2$, $R_3$, $R_4$ of the Bragg reflectors 102, 107, 112, 117, in accordance with the exemplary embodiment, are set according to the following table:

|       | $\lambda_1$ | $\lambda_2$ | $\lambda_3$ |
|-------|-------------|-------------|-------------|
| $R_1$ | = 99.7%     | ≦5%         | ≦5%         |
| $R_2$ | = 99.3%     | = 99.7%     | ≦5%         |
| $R_3$ | ≦5%         | = 99.3%     | = 99.7%     |
| $R_4$ | ≦5%         | ≦5          | = 99.3%     |

The decrease in the emitted wavelength with increasing ordinal number of the emitting optically active region ensures that the laser light emitted by a lower optically active region cannot be absorbed in an optically active region arranged thereabove. In addition, the suitable setting of the reflectivities $R_1$, $R_2$, $R_3$, $R_4$ of the Bragg reflectors 102, 107, 112, 117 ensures that the laser light emitted by one optically active region cannot be brought to resonance in another optically active region. Consequently, the three optically active regions 104, 110, 114 are optically decoupled from one another.

If the semiconductor laser 100 is then optically coupled to an optical fibre on the optical axis 118, all the optical signals emitted by the semiconductor laser 100 can be coupled into the optical fibre without the need for additional complicated coupling elements or optical elements for wavelength bundling. Consequently, the semiconductor laser 100 can emit, on the optical axis 118 in the emission direction 119, in accordance with the number n of integrated optically active regions, a bit rate that is a factor of n higher than a conventional VCSEL.

The oxide screens formed as first current confinement region 106, as second current confinement region 109 and as third current confinement region 116 are arranged in such a way that a through hole is provided in the oxide screens in the region of the optical axis 118 and a current flow is thus made possible, while a current flow is prevented outside the optical axis 118 on account of the electrical insulation effect of the oxidized AlAs.

In accordance with the exemplary embodiment, the electrical decoupling of the three optically active regions 104, 110, 114 is achieved primarily by means of the suitable doping of the Bragg reflectors 102, 107, 112, 117. Consequently, a current flow intended for the second optically active region 110 is prevented through the first optically active region 104 or through the third optically active region 114. Clearly, then, the optically active regions 104, 110, 114 are each connected in opposite direction with respect to the adjacent optically active region. Consequently, the three optically active regions 104, 110, 114 are electrically decoupled from one another and can be operated independently of one another.

As an alternative, the Bragg reflectors 102, 107, 112, 117 can be provided as electrical insulation layers without doping. In that case, however, for operating the optically active regions 104, 110, 114, it is necessary to provide in each case a separate, suitably doped electrical connection region between each Bragg reflector and each optically active region. However, for example, the intermediate regions 103, 105, 108, 111, 113, 115 can be provided, by means of suitable material selection, as electrical connection regions for the optically active regions 104, 110, 114. The three optically active regions 104, 110, 114 are thus electrically decoupled from one another by means of the electrically insulating Bragg reflectors 102, 107, 112, 117 and can be operated independently of one another.

The semiconductor laser 100 thus enables three independent optical data signals to be generated in an electrically and optically undisturbed manner, each optical data signal being assigned to one of the emitted wavelengths of the semiconductor laser 100.

As an alternative, the semiconductor laser 100 may also be realized in another material system, for example, InAlGaAsN, InAlGaAsSbN and InAlGaP on a semiconductor substrate 101 made of GaAs, or InAlGaAs, InGaAsP and AlGaAsSb on a semiconductor substrate 101 made of InP.

Figure 2:
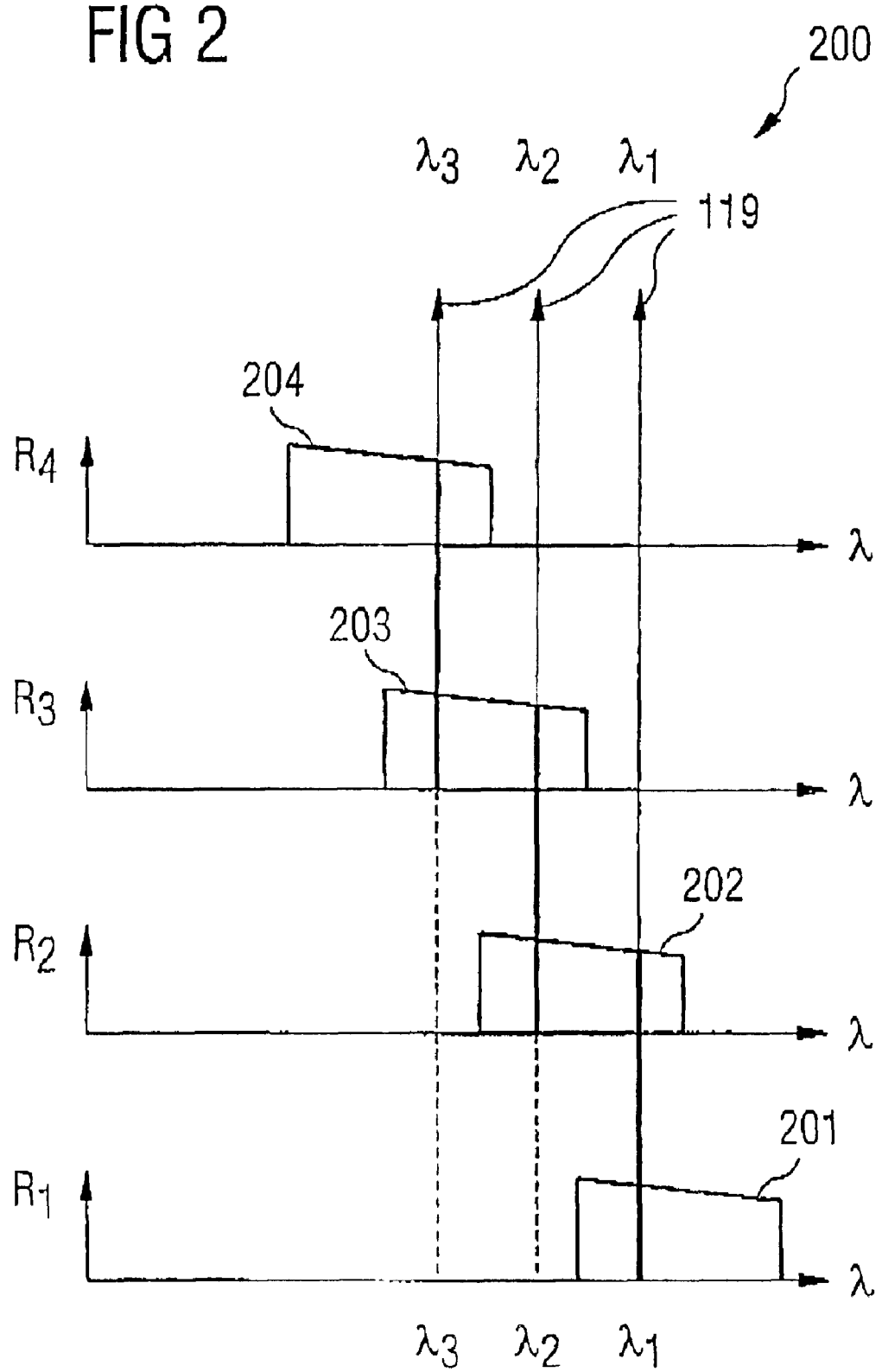
FIG. 2 shows a diagram of the reflection characteristics and the spectral position of the emitted laser light for the semiconductor laser in accordance with the exemplary embodiment of the invention.

FIG. 2 illustrates a diagram 200 of the reflection characteristics and the spectral position of the emitted laser light for the semiconductor laser 100 in accordance with FIG. 1.

The diagram 200 shows the reflection characteristics of the Bragg reflectors 102, 107, 112, 117 of the semiconductor laser 100 in separate partial diagrams. These partial diagrams illustrate the reflectivities $R_1, R_2, R_3, R_4$ of the Bragg reflectors 102, 107, 112, 117 in each case as a function of the emitted wavelength $\lambda$. In accordance with the requirements made of the Bragg reflectors 102, 107, 112, 117 as described in FIG. 1, the latter in each case have a different reflection characteristic 201, 202, 203, 204.

In accordance with the first reflection characteristic 201 of the first Bragg reflector 102 and the second reflection characteristic 202 of the second Bragg reflector 107, the laser light of the first wavelength $\lambda_1$ emitted by the first optically active region 104 is brought to resonance and emitted from the semiconductor laser 100 by the second Bragg reflector 107 in the emission direction 119. In this case, the reflection characteristics 203, 204 of the third and fourth Bragg reflectors 112, 117 exhibit a negligible reflection of the laser light emitted with the first wavelength $\lambda_1$.

Equally, in accordance with the second reflection characteristic 202 of the second Bragg reflector 107 and the third reflection characteristic 203 of the third Bragg reflector 112, the laser light of the second wavelength $\lambda_2$ emitted by the second optically active region 110 is brought to resonance and emitted from the semiconductor laser 100 by the third Bragg reflector 112 in the emission direction 119. On account of the high reflectivity $R_2$ of the second Bragg reflector 107 for the laser light emitted from the second optically active region 110 with the second wavelength $\lambda_2$, almost no laser light emitted with the second wavelength $\lambda_2$ passes into the resonance region of the first wavelength $\lambda_1$ and is thus optically decoupled therefrom. The reflection characteristic 204 of the fourth Bragg reflector 117 additionally exhibits a negligible reflection of the laser light emitted with the second wavelength $\lambda_2$.

In accordance with the third reflection characteristic 203 of the third Bragg reflector 112 and the fourth reflection characteristic 204 of the fourth Bragg reflector 117, the laser light of the third wavelength $\lambda_3$ emitted by the third optically active region 114 is brought to resonance and emitted from the semiconductor laser 100 by the fourth Bragg reflector 117 in the emission direction 119. On account of the high reflectivity $R_3$ of the third Bragg reflector 112 for the laser light emitted from the third optically active region 114 with the third wavelength $\lambda_3$, almost no laser light emitted with the third wavelength $\lambda_3$ passes into the resonance regions of the first wavelength $\lambda_1$ or of the second wavelength $\lambda_2$ and is thus optically decoupled therefrom.

Since the diagram 200 illustrates the reflection characteristics 201, 202, 203, 204 as a function of the wavelength $\lambda$, the three wavelengths $\lambda_1, \lambda_2, \lambda_3$ emitted in the emission direction 119 do not lie congruently one above the other.

Before the production of the Bragg reflectors 102, 107, 112, 117 with the corresponding reflection characteristics 201, 202, 203, 204, an empirical filter design is carried out, which is usually effected in a computer-aided manner. In order to obtain a Bragg reflector with an as far as possible narrowband reflection characteristic, it is possible, for example, for a corresponding number of layers with a slightly different refractive index (for example a difference $\Delta n$ between two layers that are arranged directly one on the other or next to one another of $\Delta n \approx 0.1$) and a respective thickness of $\lambda/4$ to be stacked one above the other.

As an alternative, the desired narrowband reflection characteristic can also be set by way of a variation of the cycle ratio of the layers arranged in the Bragg reflector. In this case, it is possible to reduce the number of layers required in the Bragg reflector. However, in this case, it is not layers having a thickness of in each case $\lambda/4$ that are stacked one above the other, but rather combinations of two layers which together comprise a thickness of $\lambda/2$. By way of example, such a layer combination may comprise a layer of AlGaAs having a thickness of only approximately 20 nm above a layer of AlAs having a thickness of approximately 150 nm. In this case, the reflection characteristic of the layer combination is produced in a manner dependent on the refractive indices and layer thicknesses of the two individual layers.

The following publications are cited in this document:

[1] Lim S. F., Hudgings J. A., Li G. S., Yuen W., Lau K. Y., Chang-Hasnain C. J.: "Self-pulsating and bistable VCSEL with controllable intracavity quantum-well saturable absorber" in Electronics Lett., Vol. 33, No. 20, pp. 1708–1710 (1997).

[2] Hudgings J. A., Stone R. J., Lim S. F., Li G. S., Yuen W., Lau K. Y., Chang-Hasnain C. J.: "The physics of negative differential resistance of an intracavity voltage-controlled absorber in a vertical-cavity surface-emitting laser" in Appl. Phys. Lett., Vol. 73, No. 13, pp. 1796–1798 (1998).

[3] Fischer A. J., Choquette K. D., Chow W. W., Hou H. Q., Gelb K. M.: "Coupled resonator vertical-cavity laser diode" in Appl. Phys. Lett., Vol. 75, No. 19, pp. 3020–3022 (1998).

[4] Fischer A. J., Chow W. W., Choquette K. D., Allermann A. A., Gelb K. M.: "Q-switched operation of a coupled-resonator vertical-cavity laser diode" in Appl. Phys. Lett., Vol. 76, No. 15, pp. 1975–1977 (2000).

[5] Stanley R. P., Houdré R., Oesterle U., Ilegems M., Weisbuch C.: "Coupled semiconductor microcavities" in Appl. Phys. Lett., Vol. 65, No. 16, pp. 2093–2095 (1994).

[6] Michler P., Hilpert M., Reiner G.: "Dynamics of dual-wavelength emission from a coupled semiconductor microcavity laser" in Appl. Phys. Lett., Vol. 70, No. 16, pp. 2073–2075 (1997).

[7] Pellandini P., Stanley R. P., Houdré R., Oesterle U., Ilegems M., Weisbuch C.: "Dual-wavelength laser emission from a coupled semiconductor microcavity" in Appl. Phys. Lett., Vol. 71, No. 7, pp. 864–866 (1997).

[8] Brunner M., Gulden K., Hövel R., Moser M., Carlin J. F., Stanley R. P., Ilegems M.: "Continuous-Wave Dual-Wavelength Lasing in a Two-Section Vertical-Cavity Laser" in IEEE Photonics Tech. Lett., Vol. 12, No. 10, pp. 1316–1318 (2000).

What is claimed is:

1. Semiconductor laser comprising:
   a first reflector, a second reflector and a third reflector,
   a first optically active region between the first reflector and the second reflector, which first optically active region can emit laser light of a first wavelength, and
   a second optically active region between the second reflector and the third reflector, which second optically active region can emit laser light of a second wavelength, which is shorter than the first wavelength, wherein the first optically active region is essentially decoupled both optically and electrically from the second optically active region, wherein the two optically active regions are able to emit their laser light on a common optical axis in a common emission direction, and wherein the emission direction is directed along the optical axis from the first optically active region to the second optically active region.

2. Semiconductor laser according to claim 1, in which Bragg reflectors are provided as reflectors.

3. Semiconductor laser according to claim 2, in which an intermediate region is in each case provided between each optically active region and each adjacent Bragg reflector.

4. Semiconductor laser according to claim 2 or 3, in which at least one current confinement region is arranged in at least one intermediate region adjacent to at least one optically active region.

5. Semiconductor laser according to any one of the claims 2 to 4, in which the Bragg reflectors and the active regions are arranged in stack form one above the other, as a result of which a surface-emitting semiconductor laser is formed.

6. Semiconductor laser according to any one of the claims 2 to 5, in which the first Bragg reflector is set up in such a way that it comprises a reflectivity of $\geq 99\%$ for the first wavelength and a reflectivity of $\leq 5\%$ for the second wavelength.

7. Semiconductor laser according to any one of the claims 2 to 6, in which the second Bragg reflector is set up in such a way that it comprises a reflectivity of 98% for the first wavelength and a reflectivity of $\geq 99\%$ for the second wavelength.

8. Semiconductor laser according to any one of the claims 2 to 7, in which the third Bragg reflector is set up in such a way that it comprises a reflectivity of $\leq 5\%$ for the first wavelength and a reflectivity of 98% for the second wavelength.

9. Semiconductor laser according to any one of the claims 2 to 8, in which the first Bragg reflector and the second Bragg reflector are at a distance from one another such that a Fabry-Perot resonance with a half-value width of up to 5 nm for the first wavelength can form between the first Bragg reflector and the second Bragg reflector.

10. Semiconductor laser according to any one of the claims 2 to 9, in which the second Bragg reflector and the third Bragg reflector are at a distance from one another such that a Fabry-Perot resonance with a half-value width of up to 5 nm for the second wavelength can form between the second Bragg reflector and the third Bragg reflector.

11. Semiconductor laser according to any one of the claims 2 to 10, in which at least one part of each Bragg reflector is an electrical connection region for the respectively adjacent optically active region.

12. Semiconductor laser according to claim 11, in which the electrical connection regions are doped in such a way that the electrical connection regions of the first Bragg reflector and of the third Bragg reflector comprise excess charge carriers of a first charge carrier type and the electrical connection region of the second Bragg reflector comprises excess charge carriers of a second charge carrier type.

13. Semiconductor laser according to any one of the claims 2 to 12, in which a first electric current can be coupled into the first optical region by means of the first Bragg reflector and the second Bragg reflector and a second electric current can be coupled into the second optical region by means of the second Bragg reflector and the third Bragg reflector, independently of the first electric current.

14. Semiconductor laser according to any one of the claims 2 to 13, in which the second Bragg reflector comprises a first electrical connection region for the first optically active region and a second electrical connection region—electrically insulated from the first electrical connection region—for the second optically active region.

15. Semiconductor laser according to any one of the claims 2 to 13, in which the second Bragg reflector comprises a first Bragg partial reflector for the first optically active region and a second Bragg partial reflector for the second optically active region.

16. Semiconductor laser according to claim 15, in which the two Bragg partial reflectors in each case comprise an independent electrical connection region, the two electrical connection regions of the two Bragg partial reflectors being electrically insulated from one another.

* * * * *